US012366707B2

(12) United States Patent
Liu et al.

(10) Patent No.: US 12,366,707 B2
(45) Date of Patent: Jul. 22, 2025

(54) GRADED-INDEX POLYMER WAVEGUIDE AND MANUFACTURING METHOD THEREOF

(71) Applicant: SHENNAN CIRCUITS CO., LTD., Shenzhen (CN)

(72) Inventors: Xiaofeng Liu, Shenzhen (CN); Guodong Wang, Shenzhen (CN); Hua Miao, Shenzhen (CN); Tengfei Yao, Shenzhen (CN); Rui Wang, Shenzhen (CN); Yongkai Li, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 264 days.

(21) Appl. No.: 18/051,493

(22) Filed: Oct. 31, 2022

(65) Prior Publication Data

US 2023/0084877 A1  Mar. 16, 2023

Related U.S. Application Data

(63) Continuation of application No. PCT/CN2020/132463, filed on Nov. 27, 2020.

(51) Int. Cl.
 *G02B 6/13* (2006.01)
 *G02B 6/122* (2006.01)
 *G02B 6/124* (2006.01)

(52) U.S. Cl.
 CPC ........... *G02B 6/1221* (2013.01); *G02B 6/124* (2013.01); *G02B 6/13* (2013.01)

(58) Field of Classification Search
 CPC ... B29C 33/0011; B29C 33/405; B29C 33/42; G02B 1/046; G02B 6/138; G03F 7/0005; G03F 7/0002
 USPC ...................................................... 264/1.24
 See application file for complete search history.

(56) References Cited

U.S. PATENT DOCUMENTS

| 2002/0085825 | A1* | 7/2002 | Kishimoto | G02B 6/1221 |
| | | | | 385/130 |
| 2013/0163928 | A1 | 6/2013 | Wang et al. | |
| 2013/0216779 | A1 | 8/2013 | Hofmeister et al. | |
| 2015/0093515 | A1 | 4/2015 | Subbaraman et al. | |
| 2017/0138789 | A1 | 5/2017 | Ivanov | |
| 2020/0292754 | A1 | 9/2020 | Su et al. | |

FOREIGN PATENT DOCUMENTS

| CN | 1455273 | A | 11/2003 |
| CN | 1523382 | A | 8/2004 |
| CN | 1549937 | A | 11/2004 |
| CN | 101122655 | A | 2/2008 |
| CN | 101221358 | A | 7/2008 |
| CN | 102289036 | A | 12/2011 |
| CN | 102707378 | A | 10/2012 |
| CN | 102721431 | A | 10/2012 |
| CN | 108107506 | A | 6/2018 |
| EP | 1366097 | A2 | 12/2003 |
| EP | 1366097 | B1 | 5/2007 |
| JP | 2006071917 | A | 3/2006 |
| JP | 2017187654 | A | 10/2017 |

OTHER PUBLICATIONS

Chinese First Office Action, Chinese Application No. 202011364935.X, mailed Sep. 19, 2023 (15 pages).
International search report and Written Opinion of the International Search Authority, International Application No. PCT/CN2020/132463,mailed Aug. 26, 2021(13 pages).
Chinese Second Office Action, Chinese Application No. 202011364935.X, mailed Dec. 23, 2023 (15 pages).
Chinese Rejection decision, Application No. 202011364935.X, mailed Mar. 30, 2024 (12 pages).
European Search Report, European Application No. 20962955.9, mailed Jun. 14, 2023 (10 pages).
European First examination report , European Application No. 20962955.9, mailed Apr. 17, 2025 (21 pages).

* cited by examiner

*Primary Examiner* — Hannah J Pak

(57) ABSTRACT

A graded-index polymer waveguide (30) and a manufacturing method thereof are provided. The method includes providing a waveguide substrate (1); manufacturing a waveguide lower cladding layer (2) on a surface of the waveguide substrate (1); coating a material of a waveguide core layer (3) having UV photosensitivity on a surface of the waveguide lower cladding layer (2) away from the waveguide substrate (1); performing a hot imprinting process for the material of the waveguide core layer by means of a flexible transfer film mold and forming a waveguide core layer (3) having an imprinted waveguide link structure; performing a heat treatment process for the waveguide core layer (3); performing a pre-exposure process for the waveguide core layer; coating a waveguide upper cladding layer on a surface of a waveguide core layer (3); and curing the waveguide core layer (3) and the waveguide upper cladding layer (4).

11 Claims, 2 Drawing Sheets

GRADED-INDEX POLYMER WAVEGUIDE AND MANUFACTURING METHOD THEREOF

CROSS REFERENCE

The present disclosure is a continuation of International (PCT) Patent Application No. PCT/CN2020/132463 filed on Nov. 27, 2020, the entire contents of which are hereby incorporated by reference in its entirety.

TECHNICAL FIELD

The present disclosure relates to the technical field of optical waveguides, in particular to a graded-index polymer waveguide and a manufacturing method thereof.

BACKGROUND

A polymer-based organic optical waveguide has a characteristic such as excellent mechanical property, good heat resistance, being easily-integrated, an adjustable refractive index, being highly-flexible wired, etc. Furthermore, a manufacturing process of the polymer-based organic optical waveguide is compatible with a traditional PCB processing process, which may meet a requirement of a communicating device for a high-density and complex interconnected link, and be applicable to manufacturing in batches.

Although multiple processes for forming a polymer waveguide have been developed, most of the processes are based on a photolithography technology, a stencil copying technology, and a direct writing technology, such as a photobleaching technology, a flat-plate photocopying technology, a reactive ion etching technology, a laser ablation technology, a UV laser direct writing technology, etc. Polymer waveguides manufactured by means of the above technologies are all stepped waveguides having cross-sections which tend to be designed as squares or rectangles. Roughness of sidewalls of these polymer waveguides tends to be greater, such that transmitting losses correspondingly tend to be greater. In this case, in dense waveguide links, since the roughness of the side walls of the waveguides is great, light signals may be scattered at interfaces and enter into cladding layer regions, such that cladding layer modes may be converted into guiding modes adjacent to waveguide transmissions. That is, mode conversions may occur, and severe crosstalk may be caused.

Compared to a stepped waveguide, a gradient waveguide has a stronger binding capacity for the optical signal to restrict the optical signal to propagate near a central line of the waveguide, which may reduce an adverse effect caused by the roughness of side walls and further improve a waveguide isolation degree. In this way, the crosstalk and a loss of the waveguide may be effectively reduced. In addition, compared to the stepped waveguide, the gradient waveguide has a greater transmitting band width and a less coupling loss when coupled to a circular optical fiber. Furthermore, in the gradient waveguide, differences in propagation delays among light in different transmitting modes may be reduced, and dispersion among the different transmission modes may be reduced. However, in the related art, the number of methods of manufacturing the gradient waveguide is quite few.

For example, a method of manufacturing a parabolic graded-index waveguide having a high band width by means of performing a heated melt extrusion and interfacial gelation technology for a polymer optical fiber preform in a barrel of cladding layer solution, requires manufacturing the optical fiber preform, and is not applicable to most polymer waveguide system. In addition, spaces among extruded waveguides are greater, and the extruded waveguides have greater differences in corresponding positions and a problem such as a coupling difficulty. A manufacturing method of a waveguide having a refractive index graded in a horizontal direction and a refractive index stepped in a vertical direction by means of performing an optical addressing process for a special photosensitive material, requires adopting the special photosensitive material, which has a great manufacturing cost and is not applicable for manufacturing in batches. A manufacturing method of a substantially circular graded-index waveguide by means of a 3D micro-hole direct writing technology, has a low manufacturing speed and multiple factors to be controlled, and waveguides manufactured by this method may have great position deviations, which brings a considerable difficulty to a couple between a multi-channel waveguide and a standard device, making it difficult to achieve a large-scale application.

SUMMARY OF THE DISCLOSURE

A graded-index polymer waveguide and a manufacturing method thereof are provided in the present disclosure.

According to a first aspect of the present disclosure, a manufacturing method of the graded-index polymer waveguide is provided and includes providing a waveguide substrate defining a base positioning hole; manufacturing a waveguide lower cladding layer on a surface of the waveguide substrate; coating a material of a waveguide core layer having UV photosensitivity on a surface of the waveguide lower cladding layer away from the waveguide substrate; performing a hot imprinting process for the material of the waveguide core layer by means of a flexible transfer film mold and forming the waveguide core layer having an imprinted waveguide link structure; performing a heat treatment process for the waveguide core layer having the imprinted waveguide link structure; performing a pre-exposure process for the waveguide core layer after being performed the heat treatment process; coating a waveguide upper cladding layer on a surface of the waveguide core layer after being performed the pre-exposure process; and curing the waveguide core layer and the waveguide upper cladding layer.

According to a second aspect of the present disclosure, a graded-index polymer waveguide is also provided in the present disclosure, and includes a waveguide substrate, a waveguide lower cladding layer, a waveguide core layer, and a waveguide upper cladding layer. The waveguide core layer has an imprinted waveguide link structure including a plurality of grating lines, and arranged between the waveguide lower cladding layer and the waveguide upper cladding layer. An interface diffusion occurs between the waveguide core layer and the waveguide upper cladding layer at an imprinted waveguide link, and the imprinted waveguide link structure of the waveguide core layer is hot imprinted by means of a flexible transfer film mold.

BRIEF DESCRIPTION OF THE DRAWINGS

In order to more clearly describe the technical solutions in the embodiments of the present disclosure, the following will briefly introduce the drawings required in the description of the embodiments. Obviously, the drawings in the following description are only some embodiments of the present disclosure. For those skilled in the art, other drawings can be obtained based on these drawings without creative work.

FIG. 2a shows a schematic view of a waveguide substrate, FIG. 2b shows a schematic view of the graded-index polymer waveguide including a waveguide lower cladding layer; FIG. 2c shows a schematic view of a waveguide core layer, FIG. 2d shows a schematic view of aligning a flexible transfer film mold to the waveguide core layer, FIG. 2e shows a schematic view of the flexible transfer film mold and the waveguide core layer after being pressed together, FIG. 2f shows a schematic view of the graded-index polymer waveguide having an imprinted waveguide link structure, FIG. 2g shows a schematic view of an imprinted waveguide core layer after being performed a heat treatment process, FIG. 2h shows a schematic view of the imprinted waveguide core layer after being performed a pre-exposure process, and FIG. 2j shows a schematic view of the graded-index polymer waveguide after being coated with a waveguide upper cladding layer, according to some embodiments of the present disclosure.

DETAILED DESCRIPTION

The technical solutions in the embodiments of the present disclosure will be clearly and completely described in the following with reference to the drawings in the embodiments of the present disclosure. Obviously, the embodiments described are only a part of the embodiments of the present disclosure, but not all of the embodiments. Based on the embodiments in the present disclosure, all other embodiments obtained by those of ordinary skill in the art without creative efforts shall fall within a protection scope of the present disclosure.

The terms used in the embodiments of the present disclosure is intended to describe specific embodiments, but not to limit the present disclosure. The terms "a" and "the" in a singular form used in the embodiments and claims of the present disclosure are also intended to include a form, unless other meanings are clearly indicated. The terms "multiple" or "plurality" generally indicate including at least two, but do not exclude only including one.

It should be understood that the term "and/or" herein is simply configured to describe an association relationship of associated objects, indicating three relationships may exist. For example, A and/or B, may mean three cases that A exists alone, A and B exist simultaneously, and B exists alone. In addition, a character "/" herein generally indicates a "or" relationship between an object before the character "/" and a related object behind the character "/".

It should be understood that the terms "comprise", "include" or any other variations thereof are meant to cover non-exclusive including, so that the process, method, article or device comprising a series of elements do not only include those elements, but also include other elements that are not explicitly listed or also include the inherent elements of the process, method, article or device. In the case that there are no more restrictions, an element qualified by the statement "comprise . . . " does not exclude the presence of additional identical elements in the process, method, article or device that includes the element.

"Embodiment" herein means that a particular feature, structure, or characteristic described with reference to embodiments may be included in at least one embodiment of the present disclosure. The term appearing in various places in the specification are not necessarily as shown in the same embodiment, and are not exclusive or alternative embodiments that are mutually exclusive with other embodiments. Those skilled in the art will understand explicitly and implicitly that the embodiments described herein may be combined with other embodiments.

Figure 1:
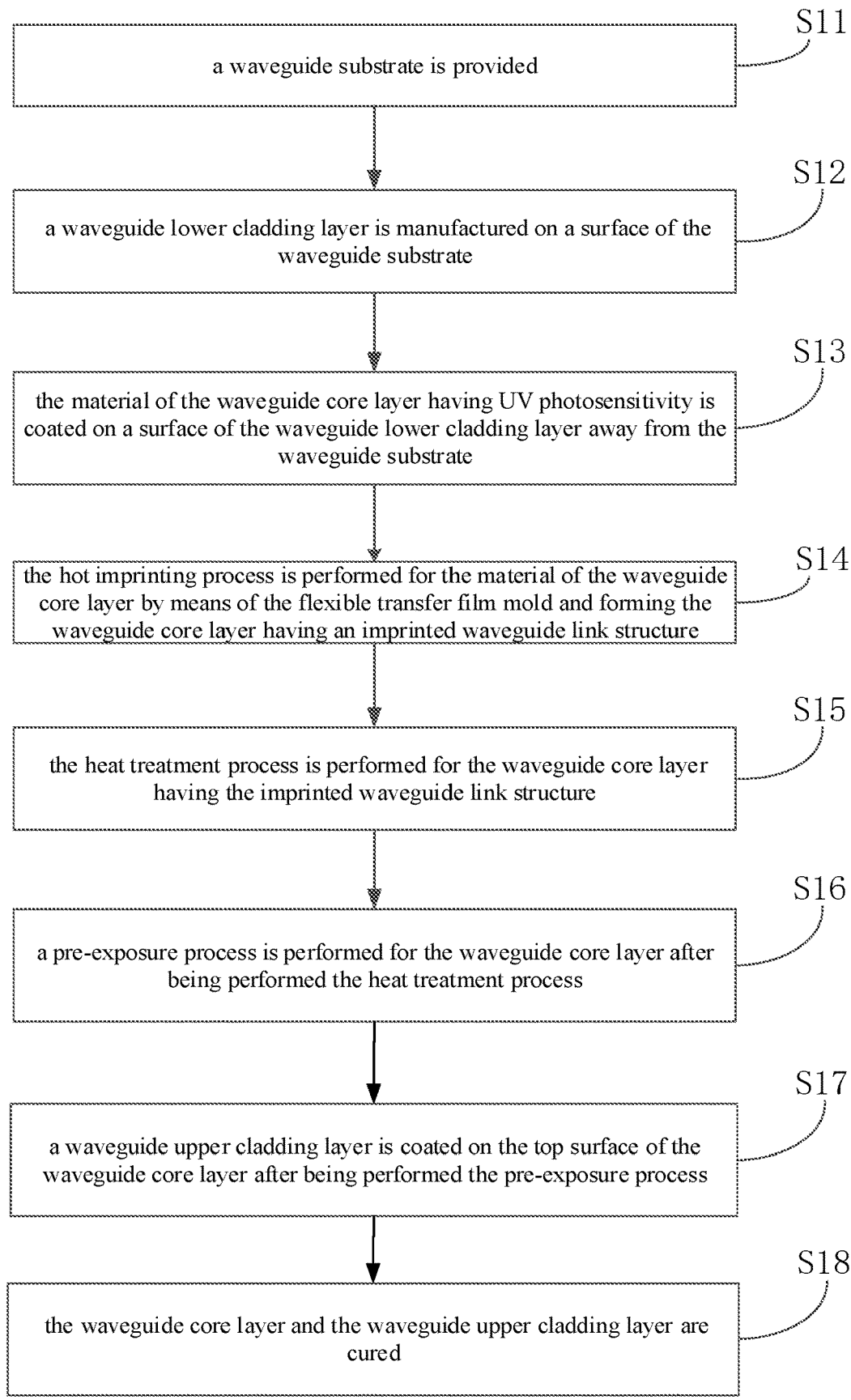
FIG. 1 is a schematic flowchart of a manufacturing method of a graded-index polymer waveguide according to an embodiment of the present disclosure.

As shown in FIG. 1, FIG. 1 is a schematic flowchart of a manufacturing method of a graded-index polymer waveguide according to an embodiment of the present disclosure. The method may include the following operations.

In an operation S11, a waveguide substrate is provided.

Figure 2:
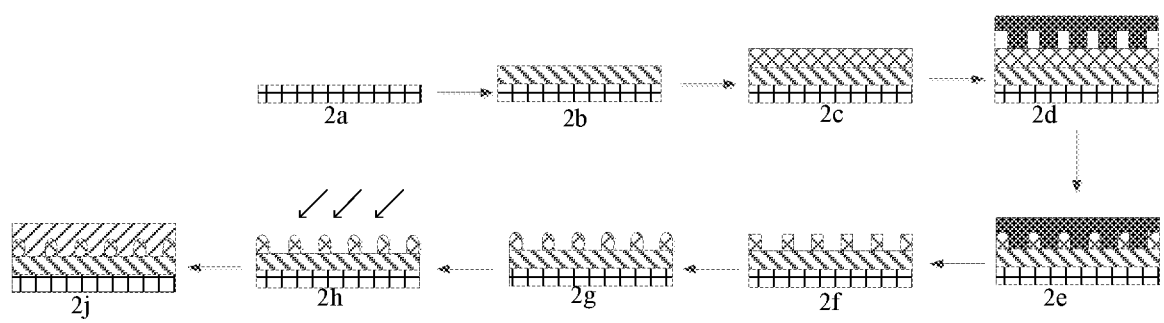
FIG. 2 is a schematic view of a change in a structure of the graded-index polymer waveguide in manufacturing operations of the graded-index polymer waveguide in FIG. 1 according some embodiments of the present disclosure. Specifically.

As shown in FIG. 2, FIG. 2 is a schematic diagram of a change in a structure of the graded-index polymer waveguide in manufacturing operations of the graded-index polymer waveguide in FIG. 1. As shown in FIG. 2a, FIG. 2a shows a schematic view of a waveguide substrate, the waveguide substrate is a flat substrate. In this embodiment, the waveguide substrate defines the base positioning hole, and the base positioning hole is configured to fix the waveguide substrate or the graded-index polymer waveguide at a specific position, so as to facilitate performing a hot imprinting process for the waveguide core layer by means of a flexible transfer film mold at a specific position. In this embodiment, the graded-index polymer waveguide is manufactured on the waveguide substrate. A material of the waveguide substrate may be any one of a FR-4 substrate, a Si substrate, an organic glass substrate, and an ITO glass substrate. Before the graded-index polymer waveguide is manufactured on the waveguide substrate, it is required to perform an ultrasonic cleaning process or an ion cleaning process and a surface activation treatment for the waveguide substrate.

In an operation S12, a waveguide lower cladding layer is manufactured on a surface of the waveguide substrate.

As shown in FIG. 2b, FIG. 2b shows a schematic view of the graded-index polymer waveguide including a waveguide lower cladding layer, the surface of the waveguide substrate is coated with a layer of the waveguide lower cladding layer. The waveguide lower cladding layer is a polymer film. In this embodiment, the waveguide lower cladding layer has a thickness in a range of 5-100 µm. In other embodiments, the thickness of the waveguide lower cladding layer may be adjusted according to actual production requirements. The waveguide lower cladding layer may have an interface diffusion with a material of a waveguide core layer at an interface junction.

In an operation S13, the material of the waveguide core layer having UV photosensitivity is coated on a surface of the waveguide lower cladding layer away from the waveguide substrate.

As shown in FIG. 2c, FIG. 2c shows a schematic view of a waveguide core layer, a layer of a material having the UV photosensitivity is coated on the surface of the waveguide lower cladding layer, and an obtained pattern is shown in FIG. 2c. In this embodiment, the material of the waveguide core layer is any one of a siloxane-based polymer, an epoxy-based polymer, an acrylic/ester-based polymer, or a benzocyclobutene-based polymer. In other embodiments, the material of the waveguide core layer may be other substances. The material of the waveguide core layer has the UV photosensitivity, and may forms a dry film under irradiation of an UV light. In this embodiment, the material of the waveguide core layer may form the dry film having a thickness in a range of 5-100 μm under the irradiation of the UV light. In another embodiment, a thickness of the waveguide core layer, i.e., the thickness of the dry film, may be adjusted adaptively according to actual needs, which will not be limited herein.

In an operation S14, the hot imprinting process is performed for the material of the waveguide core layer by means of the flexible transfer film mold and forming the waveguide core layer having an imprinted waveguide link structure.

As shown in FIG. 2d, FIG. 2e, and FIG. 2f, FIG. 2d shows a schematic view of aligning a flexible transfer film mold to the waveguide core layer, FIG. 2e shows a schematic view of the flexible transfer film mold and the waveguide core layer after being pressed together, and FIG. 2f shows a schematic view of the graded-index polymer waveguide having an imprinted waveguide link structure, a structure of the waveguide core layer having the imprinted waveguide link structure obtained by performing the hot imprinting process for the waveguide core layer by means of the flexible transfer film mold is as shown in FIG. 2f. A specific manufacturing process is as shown in FIGS. 2d and 2e, an operation of performing the hot imprinting process for the material of the waveguide core layer by means of the flexible transfer film mold and forming the waveguide core layer having the imprinted waveguide link structure may include four operations. In the first operation, the waveguide substrate is placed on a highly flat base, and in fixed at the specific position through the base positioning hole in the waveguide substrate, so as to facilitate the flexible transfer film mold aligning with the waveguide substrate. In the second operation, the flexible transfer film mold is carefully placed on a conveyor belt of a flat-plate vacuum laminator having a recognizing system for a plate-surface alignment, and a surface of a mold (i.e., the flexible transfer film mold) is contacted to a surface of a polymer core film (i.e., a top surface of the waveguide core layer) by means of a CCD positioning system to achieve a precise alignment between the mold and the polymer core film. In the third operation, the hot imprinting process is performed for the flexible transfer film mold and a substrate structure including the waveguide core layer under a certain vacuum, temperature, and pressure, such that the flexible transfer film mold is closely attached to the material of the waveguide core layer and further slowly sinks into the material of the waveguide core layer. In this way, a groove of the flexible transfer film mold may be completely filled with the material of the waveguide core layer. In the fourth operation, the polymer waveguide substrate including the waveguide core layer is sufficiently cooled down, and subsequently a flexible imprinting film mold (i.e., the flexible transfer film mold) is stripped from the polymer waveguide substrate, so as to form the imprinted waveguide link structure including multiple grating lines on a core layer film (i.e., the waveguide core layer).

In this embodiment, the flexible transfer film mold is made by directly writing on a surface of any one material of a silicon-based glass, a quartz glass, a silicon wafer, or a metal by means of a femtosecond laser. In other embodiments, the flexible transfer film mold may be made in other ways, which is not limited herein. In some embodiments, the flexible transfer film mold may have a thickness in a range of 2-5 mm. A material of the flexible transfer film mold is any one of polydimethylsiloxane polymer and silicone rubber.

In this embodiment, the flexible transfer film mold has an imprint-reversed waveguide link structure, which may define the imprinted waveguide link structure including multiple gating lines on the top surface of the waveguide core layer.

As the mold for manufacturing the waveguide core layer, the flexible transfer film mold defines multiple grid-shaped grooves. In this embodiment, depths of grooves of the flexible transfer film mold are slightly greater than a thickness of a pre-manufactured waveguide core layer. In some embodiments, a difference between thickness or the depths of the grooves of the flexible transfer film mold and the thickness of the waveguide core layer is in a range of 2-5 μm. In this embodiment, widths of the grooves of the flexible transfer film mold are slightly less than a width of the pre-manufactured waveguide core layer. In some embodiments, a difference between the widths of the grooves of the flexible transfer film mold and the width of the pre-manufactured waveguide core layer is in a range of 5-10 μm.

In this embodiment, the polymer waveguide is processed by means of a soft lithography technology in the operation S14, which improves a possibility of manufacturing the polymer waveguide in batches. The top surface of the waveguide core layer is processed by means of a heat treatment process, such that the top surface of the waveguide core layer may be smother, and a smooth interface layer of a side wall may be obtained. In this way, it may be easier to separate the waveguide core layer from the flexible transfer film mold, reducing dependence of the side wall of the waveguide on a high precision of the flexible imprinting film mold (i.e., the flexible transfer film mold). In this embodiment, the waveguide core layer having the imprinted waveguide link structure including smooth side walls may be obtained without a significantly fine flexible transfer film mold or a flexible transfer film mold having a significantly high precision. In a case where a requirement for a fine mold is reduced, a yield of manufacturing imprinted waveguide link structure may be improved. In this embodiment, the polymer waveguide is manufactured in a way of the waveguide core layer being directly imprinted by means of an imprinting mold (i.e., the flexible transfer film mold), such that a manufacturing period may be short, a manufacturing process may be simple and has a high precision, facilitating achieving a Roll-to-Roll process. Furthermore, the manufacturing process does not involve a complex forming process such as a photolithography, a dry etching, etc., and the flexible transfer film mold adopted may be reused many times, which has a good economic effect.

In an operation S15, the heat treatment process is performed for the waveguide core layer having the imprinted waveguide link structure.

The heat treatment process is performed for the waveguide core layer having the imprinted waveguide link structure, such that morphology of the top surface of the waveguide core layer turns to a substantially circular structure which is as shown in FIG. 2g, FIG. 2g shows a schematic view of an imprinted waveguide core layer after being performed a heat treatment process. In this embodiment, a thermal oven is adopted to perform a heating process for the waveguide core layer having the imprinted waveguide link structure. In this embodiment, the morphology of the top surface of the waveguide core layer may be regulated under a condition of heating, so as to smooth the top surface of the waveguide core layer and make the morphology of the top surface of the waveguide core layer form the substantially circular structure. In this embodiment, the top surface of the waveguide core layer which contacts a bottom surface of the waveguide upper cladding layer may have a substantially circular structure by performing the heat treatment process for waveguide core layer, and naturally remains a substantially circular structure after the interface diffusion, so as to facilitate coupling to a standard device such as an optical fiber.

In an operation S16, a pre-exposure process is performed for the waveguide core layer after being performed the heat treatment process.

As shown in FIG. 2h, FIG. 2h shows a schematic view of the imprinted waveguide core layer after being performed a pre-exposure process, the pre-exposure process is performed for the waveguide core layer which is imprinted after being performed the heat treatment process, such that the waveguide core layer is in a semi-cured state. In this way, a morphology of the waveguide may be restrained. In addition, the waveguide core layer may maintain good permeability, which is conducive to the interface diffusion between a core layer structure and a cladding material after coating the waveguide upper cladding layer, so as to form a grade-index layer having a certain thickness. In this embodiment, an UV device may be adopted to apply 20-50% of radiating energy required for completely curing an imprinted waveguide adhesive to perform the pre-exposure process.

In this embodiment, the waveguide core layer may be physically cured after the heat treatment process is performed for the obtained waveguide core layer in the operation S15. The material of the waveguide core layer may be cross-linked and cured and form a semi-cured crosslink after the pre-exposure process is performed for the waveguide core layer in the operation S16, such that the waveguide core layer may be capable of having diffusing processes with waveguide cladding layers at interface junctions. In this embodiment, a light curing process and a heat curing process are performed for the material of the waveguide core layer, such that the top surface of the waveguide core layer may form the substantially circular structure in a semi-cured state. In other embodiments, the heat curing process or the light curing process may be adopted alone to fix the top surface of the waveguide core layer. A specific implementation may be selected based on the material of the waveguide core layer, which is not limited herein.

In an operation S17, a waveguide upper cladding layer is coated on the top surface of the waveguide core layer after being performed the pre-exposure process.

As shown in FIG. 2j, FIG. 2j shows a schematic view of the graded-index polymer waveguide after being coated with a waveguide upper cladding layer, the waveguide upper cladding layer is coated on the top surface of the waveguide core layer, and a structure thereof is shown in FIG. 2j. In this embodiment, a material of the coated waveguide upper cladding layer and the material of the waveguide core layer may have an interface diffusion under the condition of heating, such that a graded-index waveguide core layer structure may be formed at an interface between the waveguide core layer and the waveguide upper cladding layer. In this embodiment, the graded-index polymer waveguide may be manufactured by the waveguide core layer having free diffusing processes with the waveguide cladding layers at interfaces and forming the graded-index layer having the certain thickness. The waveguide core layer having interface diffusions with the waveguide cladding layers (mainly with the lower waveguide cladding layer) at the interfaces are determined based on material properties thereof. A manufacturing method of the waveguide core layer having the interface diffusions with the waveguide cladding layers by means of heating is simple and easily-controlled, where only process conditions of curing the waveguide core layer and the waveguide cladding layers are required to be controlled to achieve manufacturing the graded-index polymer waveguide.

In an operation S18, the waveguide core layer and the waveguide upper cladding layer are cured.

In some embodiments, the waveguide core layer and the waveguide upper cladding layer are cured by means of the UV light irradiation or heating, and the graded-index polymer waveguide may be manufactured after curing the waveguide core layer and the waveguide upper cladding layer.

These embodiments may achieve the following benefits. The imprinted waveguide link structure may be formed by performing the hot imprinting process for the waveguide core layer by means of the flexible transfer film mold, such that manufacturing the polymer waveguide in batches may be achieved. Furthermore, the flexible transfer film mold may be reused, saving a cost of manufacturing a new flexible transfer film mold. In a process of forming the waveguide core layer having the imprinted waveguide link structure, by performing the hot imprinted process, surfaces of the side walls of the waveguide core layer may be smooth, such that dependence of manufacturing a low-roughness waveguide on the mold having the high precision. In addition, through the waveguide core layer in the semi-cured sate having the interface diffusions with materials of the waveguide cladding layers at the interface junctions, the top surface of the waveguide core layer may form the substantially circular structure and the graded-index polymer waveguide may be formed. The method includes simple operations and is easy to control, which has the good economic effect.

Figure 3:
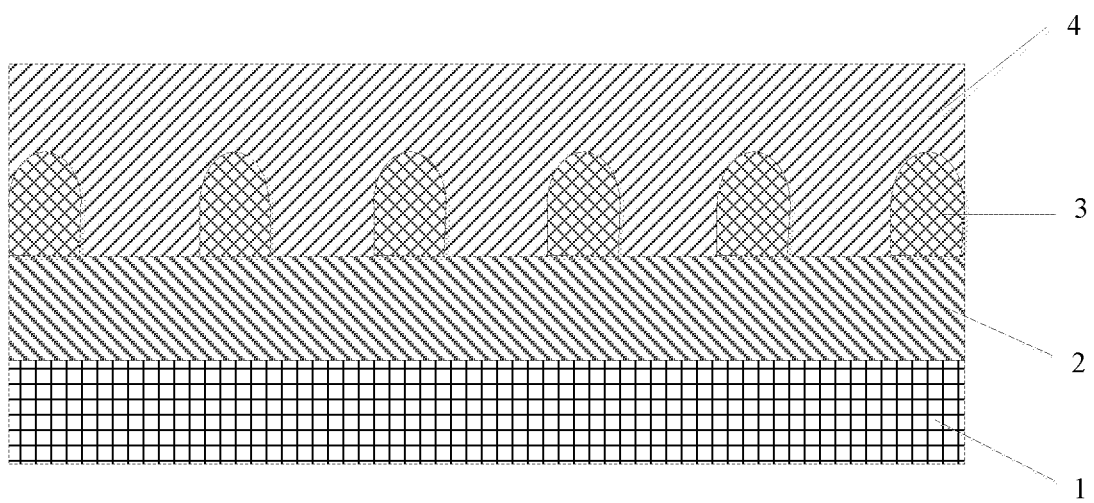
FIG. 3 is a structural schematic view of the graded-index polymer waveguide according to an embodiment of the present disclosure.

A graded-index polymer waveguide is provided in some embodiments of the present disclosure, and has a structure as shown in FIG. 3. FIG. 3 is a structural schematic view of the graded-index polymer waveguide according to an embodiment of the present disclosure.

The graded-index polymer waveguide 30 includes a waveguide substrate 1, a waveguide lower cladding layer 2, a waveguide core layer 3, and a waveguide upper cladding layer 4. The waveguide lower cladding layer 2 is located on a surface of the waveguide substrate 1, and the waveguide core layer 3 is located on a surface of the waveguide lower cladding layer 2 far away from the waveguide substrate 1. The waveguide upper cladding layer 4 is located on a surface of the waveguide core layer 3 far away from the waveguide substrate 1, and forming a protecting layer of the waveguide core layer 3 together with the waveguide lower cladding layer 2, so as to wrap the waveguide core layer 3. The waveguide core layer 3 has an imprinted waveguide link structure including multiple grating lines.

A material of the waveguide core layer 3 is any one of a siloxane-based polymer, an epoxy-based polymer, an acrylic/ester-based polymer, or a benzocyclobutene-based polymer, and has UV photosensitivity. The material of the waveguide core layer may form a dry film has a certain thickness under irradiation of an UV light. In this embodiment, the waveguide core layer 3 is the dry film having the imprinted waveguide link structure including the multiple gating lines. In an embodiment, the dry film has a thickness in a range of 5-100 μm. The imprinted waveguide link structure of the waveguide core layer 3 is formed by a hot imprinting process performed under a certain vacuum, temperature, and pressure by means of the flexible transfer film mold. The hot imprinting process is performed by means of the flexible transfer film mold, such that an imprinted waveguide link structure obtained after each hot imprinting process may be ensured to be the same. In this way, manufacturing the graded-index polymer waveguide in batches may be achieved, and a manufacturing cost may be significantly saved since the flexible transfer film mold may be reused.

The flexible transfer film mold is made by a directly-writing process. In an embodiment, the flexible transfer film mold is made by directly writing on a surface of a glass or surfaces of other materials by means of a femtosecond laser. In this embodiment, the material of the flexible transfer film mold is any one of polydimethylsiloxane polymer and silicone rubber. In other embodiments, other materials may be adopted. In this embodiment, a substrate for manufacturing the flexible transfer film mold may be a material such as a silicon-based glass, a quartz glass, a silicon wafer, a metal, or the like. In other embodiments, the material of the substrate for manufacturing the flexible transfer film mold may be selected based on the material of the mold to be manufactured, which is not limited herein.

In some embodiments, a material of the waveguide substrate 1 may be any one of a FR-4 substrate, a Si substrate, an organic glass substrate, and an ITO glass substrate. A side surface of the waveguide substrate 1 away from the waveguide upper cladding layer 4 of the waveguide defines multiple positioning holes. The positioning holes are configured to fix the waveguide substrate 1 on a highly-flat base. The flexible transfer film mold defines aligning holes. The aligning holes are configured to fix the flexible transfer film mold on a conveyor belt of the flat-plate vacuum laminator of an alignment-recognizing system. A CCD positioning system is configured to precisely align the flexible transfer film mold to the waveguide core layer, and further make a surface of the flexible transfer film mold contacts with the top surface of the waveguide core layer, so as to achieve the hot imprinting process. Through a method of positioning by means of the positioning holes, positioning positions of the waveguide core layer and the flexible transfer film mold may be effectively controlled, such that a manufactured shape of the imprinted waveguide link structure may be controlled, so as to facilitate manufacturing in batches.

In this embodiment, the waveguide core layer is the dry film having the thickness in the range of 5-100 μm. The top surface of the waveguide core layer may be smooth due to a surface tension thereof under the condition of heating.

These embodiments may achieve the following benefits. The graded-index polymer waveguide provided in the embodiments is simple to be manufactured, has good mechanical properties and good heat resistance, and is flexible to wire, which may meet a requirement of a communication device for a high-density and complex interconnected link.

The above description shows only an implementation of the present disclosure, and does not limit the scope of the present disclosure. Any equivalent structure or equivalent process transformation performed based on the specification and the accompanying drawings of the present disclosure, directly or indirectly applied in other related technical fields, shall be equally included in the scope of the present disclosure.

What is claimed is:

1. A manufacturing method of a graded-index polymer waveguide, comprising:
providing a waveguide substrate;
manufacturing a waveguide lower cladding layer on a surface of the waveguide substrate;
coating a material of a waveguide core layer having UV photosensitivity on a surface of the waveguide lower cladding layer away from the waveguide substrate;
performing a hot imprinting process for the material of the waveguide core layer by means of a flexible transfer film mold and forming the waveguide core layer having an imprinted waveguide link structure;
performing a heat treatment process for the waveguide core layer having the imprinted waveguide link structure, wherein morphology of a top surface of the waveguide core layer turns to a circular structure;
performing a pre-exposure process for the waveguide core layer after being performed the heat treatment process;
coating a waveguide upper cladding layer on a surface of the waveguide core layer after being performed the pre-exposure process; and
curing the waveguide core layer and the waveguide upper cladding layer.

2. The manufacturing method of the graded-index polymer waveguide according to claim 1, wherein the performing a hot imprinting process for the material of the waveguide core layer by means of a flexible transfer film mold and forming the waveguide core layer having an imprinted waveguide link structure comprises:
separating the flexible transfer film mold from the waveguide core layer and forming the waveguide core layer having the imprinted waveguide link structure comprising a plurality of grating lines.

3. The manufacturing method of the graded-index polymer waveguide according to claim 1, wherein the waveguide substrate is any one of a FR-4 substrate, a Si substrate, an organic glass substrate, and an ITO glass substrate.

4. The manufacturing method of the graded-index polymer waveguide according to claim 1, wherein a material of the flexible transfer film mold is any one of polydimethylsiloxane polymer and silicone rubber.

5. The manufacturing method of the graded-index polymer waveguide according to claim 4, wherein the flexible transfer film mold is made by directly writing on a surface of any one material of a silicon-based glass, a quartz glass, a silicon wafer, or a metal by means of a femtosecond laser.

6. The manufacturing method of the graded-index polymer waveguide according to claim 5, wherein a groove in a grid shape is defined in the flexible transfer film mold, and the flexible transfer film mold has a thickness in a range of 2-5 mm.

7. The manufacturing method of the graded-index polymer waveguide according to claim 6, wherein a difference between a depth of the groove of the flexible transfer film mold and a thickness of the waveguide core layer is less than 5 μm.

8. The manufacturing method of the graded-index polymer waveguide according to claim 1, wherein the material of the waveguide core layer is any one of a siloxane-based polymer, an epoxy-based polymer, an acrylic/ester-based polymer, or a benzocyclobutene-based polymer.

9. The manufacturing method of the graded-index polymer waveguide according to claim 1, wherein the material of the waveguide core layer forms a dry film under irradiation of an UV light.

10. The manufacturing method of the graded-index polymer waveguide according to claim 9, wherein the dry film has a thickness in a range of 5-100 μm.

11. The manufacturing method of the graded-index polymer waveguide according to claim 1, wherein the waveguide lower cladding layer has a thickness in a range of 5-100 μm.

* * * * *